United States Patent
Clark

(10) Patent No.: US 7,147,486 B2
(45) Date of Patent: Dec. 12, 2006

(54) METHOD AND APPARATUS FOR ATTACHING A SENSOR ASSEMBLY IN A CONTROL UNIT

(75) Inventor: Jeffrey A. Clark, Sterling Heights, MI (US)

(73) Assignee: Siemens VDO Automotive Corporation, Auburn Hills ( * ) Notice: Subject to any disclaimer, the term of this patent is extended or adjusted under 35 U.S.C. 154(b) by 0 days.

(21) Appl. No.: 11/074,148

(22) Filed: Mar. 7, 2005

(65) Prior Publication Data

US 2005/0146340 A1 Jul. 7, 2005

Related U.S. Application Data

(62) Division of application No. 10/445,526, filed on May 27, 2003, now Pat. No. 6,913,472.

(60) Provisional application No. 60/392,146, filed on Jun. 28, 2002.

(51) Int. Cl.
  *H01R 12/00* (2006.01)
(52) U.S. Cl. .................... 439/76.1
(58) Field of Classification Search ........... 439/76.6, 439/34, 64–65, 74, 45, 493, 494
  See application file for complete search history.

(56) References Cited

U.S. PATENT DOCUMENTS

| | | | |
|---|---|---|---|
| 4,922,381 A | | 5/1990 | Longerich |
| 5,003,824 A | * | 4/1991 | Fukada et al. ............... 73/651 |
| 5,085,079 A | * | 2/1992 | Holdren et al. .......... 73/514.23 |
| 5,602,734 A | * | 2/1997 | Kithil ......................... 701/45 |
| 5,633,461 A | * | 5/1997 | Kakizaki et al. ............ 73/493 |
| 5,650,567 A | * | 7/1997 | Ueda et al. .................. 73/493 |
| 5,933,343 A | | 8/1999 | Lu |
| 6,094,984 A | * | 8/2000 | Asano et al. ................ 73/493 |
| 6,684,141 B1 | * | 1/2004 | Koors ......................... 701/45 |
| 6,728,110 B1 | * | 4/2004 | Koyama .................... 361/752 |
| 6,913,472 B1 | * | 7/2005 | Clark .......................... 439/74 |

FOREIGN PATENT DOCUMENTS

| | | |
|---|---|---|
| DE | 3817879 | 11/1989 |
| DE | 19709243 | 6/1998 |
| DE | 19841258 | 3/2000 |
| DE | 10159113 | 6/2003 |
| EP | 0 427 106 A2 | 5/1991 |
| WO | WO 98/12904 | 7/1997 |

OTHER PUBLICATIONS

Translation of DE 10159113.
Translation of DE 3817879.

* cited by examiner

*Primary Examiner*—J. F. Duverne

(57) ABSTRACT

A control unit for a safety restraint device includes a main printed circuit board that supports lateral and vertical acceleration sensors and an auxiliary printed circuit board that supports rollover sensors. The main and auxiliary printed circuit boards are spaced apart from and are positioned in an overlapping relationship to each other within a housing. A pin connection provides electrical connection between the main and auxiliary printed circuit boards to permit signal transfers between the main and auxiliary printed circuit boards. A common fastener is used to connect both the main and auxiliary printed circuit boards to the housing. A cover is used to enclose the main and auxiliary printed circuit boards within the housing. The fastener extends through the cover, through both the main and auxiliary printed circuit boards, and finally into the housing.

20 Claims, 1 Drawing Sheet

METHOD AND APPARATUS FOR ATTACHING A SENSOR ASSEMBLY IN A CONTROL UNIT

CROSS-REFERENCE TO RELATED APPLICATIONS

The application is a DIV of and claims priority to U.S. application Ser. No. 10/445,526 filed on May 27, 2003 now U.S. Pat. No. 6,913,472, which claims priority to U.S. Provisional Application No. 60/392,146, which was filed on Jun. 28, 2002.

BACKGROUND OF THE INVENTION

This invention relates to a method and apparatus for attaching a sensor assembly within a control unit that is used to deploy a safety restraint device.

Electronic control units for deploying safety restraint devices include a plurality of sensors and a printed circuit board, which interact with each other to control deployment of the safety restraint device under appropriate vehicle crash conditions. Traditionally, a single printed circuit board is used to support all of the sensors. Thus, the lateral and vertical acceleration sensors as well as the rollover sensors are all mounted to the same circuit board.

This mounting configuration has several disadvantages. First, the size of the circuit board must be large enough to accommodate all of the sensors, in addition to their associated electronics. This takes up a significant amount of packaging space. Another disadvantage is that this mounting configuration has a tendency to resonate at lower frequencies. This resonation can adversely affect sensor signals, resulting in measurement and signal conversion inaccuracies.

Thus, it is desirable to have a control unit and sensor assembly that allows the size of the printed circuit board to be decreased to provide a more compact unit, and which further eliminates inaccuracies caused by vibrations, as well as overcoming the other above mentioned deficiencies with the prior art.

SUMMARY OF THE INVENTION

A control unit for a safety restraint device includes a main printed circuit board that supports a first sensor and a secondary or auxiliary printed circuit board that supports a second sensor. The main and auxiliary printed circuit boards are spaced apart from and are positioned in an overlapping relationship to each other within a housing. A common attachment member is used to connect both the main and auxiliary printed circuit boards to the housing.

In one disclosed embodiment, the control unit and sensor assembly for a safety restraint device includes a housing, non-coplanar first and second printed circuit boards supported within the housing, and a fastener that attaches both printed circuit boards to the housing. A rigid tubular member is positioned between the first and second printed circuit boards. The rigid tubular member is aligned with first and second openings formed within the first and second printed circuit boards, respectively. The fastener extends through the first and second openings, through the rigid tubular member, and has a distal end that is embedded within a wall of the housing.

In one disclosed embodiment, the first printed circuit board comprises a main or primary printed circuit board and the second printed board comprises an auxiliary or secondary printed circuit board. Acceleration sensors that measure lateral and/or vertical vehicle accelerations are preferably mounted on the main printed circuit board. A rollover sensor assembly, which measures a vehicle angular rate, is separated from the other sensors and is mounted to the auxiliary printed circuit board.

In one disclosed embodiment, more than one fastener is used to attach the printed circuit boards to the housing. In this embodiment, each fastener is spaced apart from one another and each fastener extends through both the first and second printed circuit boards. Distal ends of the fasteners are embedded in a wall of the housing.

The subject method and apparatus provides a more compact control unit and sensor assembly for deploying a safety restraint device. These and other features of the present invention can be best understood from the following specifications and drawings, the following of which is a brief description.

DETAILED DESCRIPTION OF A PREFERRED EMBODIMENT

Figure 1:
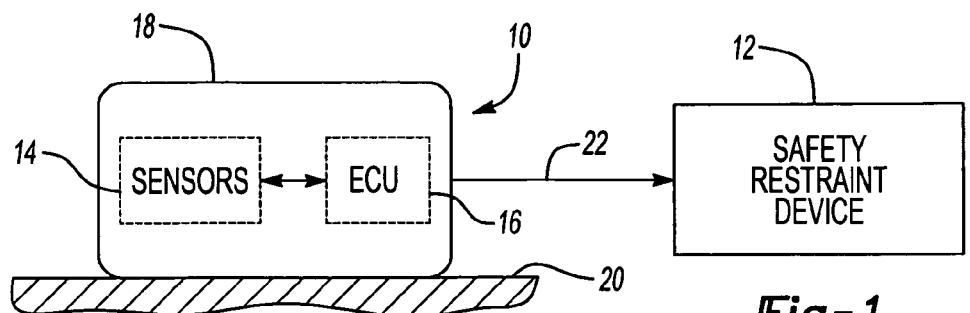
FIG. 1 a schematic view of a vehicle system incorporating the subject invention.

A control unit and sensor assembly, shown generally at 10 in FIG. 1, measures and analyzes multiple vehicle characteristics to determine whether conditions are appropriate for deploying a safety restraint device 12. The control unit and sensor assembly 10 includes plurality of sensors 14 that transmit signals to an electronic control and processing unit (ECU) 16. The sensors 14 and ECU 16 are enclosed within a housing 18, which is mounted to a vehicle structure 20. The ECU 16 monitors the sensor signal and generates an activation signal 22 when the ECU 16 determines that conditions are appropriate to activate the safety restraint device 12.

Preferably, the control unit and sensor assembly 10 is mounted near a vehicle width centerline. Also, the control unit and sensor assembly 10 is preferably positioned as close to a vehicle firewall as possible, such as within the center counsel area in the vehicle.

Figure 2:
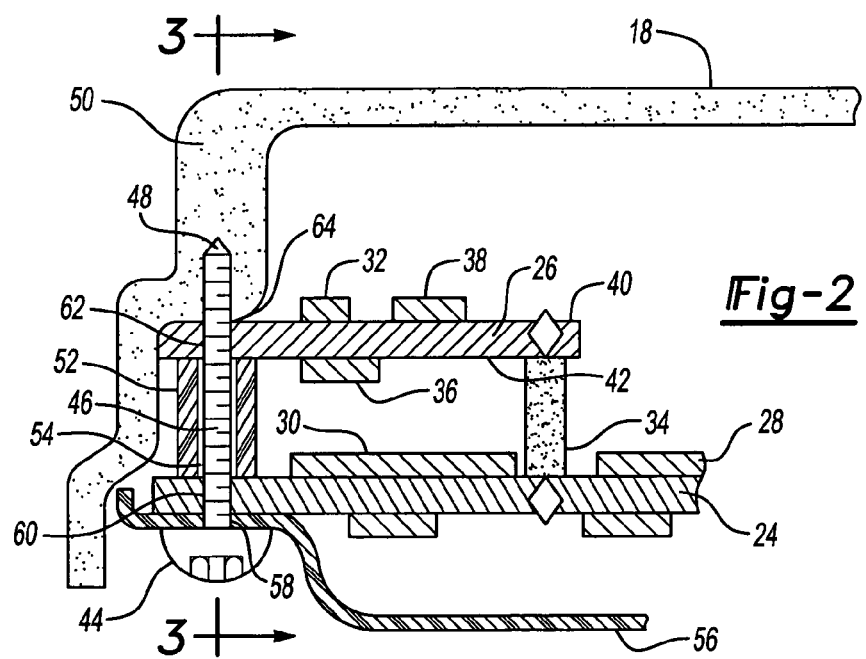
FIG. 2 is a cross-sectional view, partially cut away, of a vehicle system control unit incorporating the subject invention.

The control unit and sensor assembly 10 includes a primary or main printed circuit board 24 and a secondary or auxiliary printed circuit board 26. The auxiliary printed circuit board 26 is non-coplanar with the main printed circuit board 24. As shown in FIG. 2, the auxiliary printed circuit board 26 is spaced apart from and positioned in an overlapping relationship to the main printed circuit board 24. The main printed circuit board 24 supports at least one sensor assembly 28, as well as supporting ECU associated electronics 30. The auxiliary printed circuit board 26 supports at least one additional sensor assembly 32. A pin connection 34 is used to electronically connect the auxiliary printed circuit board 26 to the main printed circuit board 24. Any type of pin connection 34 known in the art, such as a standard bandolier standoff, press-fit connection or solder joint, for example, could be used to form this connection.

Preferably, the sensor assembly 28 mounted on the main printed circuit board 24 includes acceleration sensors that measure lateral and/or longitudinal vehicle accelerations, while the additional sensor assembly 32 supported on the auxiliary printed circuit board 26 includes a rollover sensor that measures an angular rollover or turning rate. It should be understood that each of the sensor assemblies 28, 32 could be comprised of a single sensor or could be comprised of multiple sensors. Also, while it is preferable to separate the lateral and longitudinal acceleration sensors from the rollover sensors, the auxiliary printed circuit board 26 could be configured to support lateral and vertical acceleration sensors in addition to, or in place of, the rollover sensors.

Further, any associated sensor electronics 36 for the additional sensor assembly 32, are preferably mounted on the auxiliary printed circuit board 26. The associated sensor electronics 36 or any additional sensors or sensor components 38 used to form the additional sensor assembly 32 can be positioned on an upper surface 40 or on a lower surface 42 of the auxiliary printed circuit board 26, depending upon packaging constraints.

At least one attachment member 44 is used to secure both the main 24 and auxiliary 26 printed circuit boards to the housing 18. The attachment member 44 includes a body portion 46 that extends through both the main 24 and auxiliary 26 printed circuit boards. A distal end 48 of the body portion 46 extends into or is embedded within a wall 50 of the housing 18.

A rigid tubular standoff or spacer 52 is positioned between the main 24 and auxiliary 26 printed circuit boards. The spacer 52 includes a bore 54 through which the attachment member 44 is inserted. A cover 56 is used to enclose the main 24 and auxiliary 26 printed circuit boards within the housing 18. The cover also provides a protected environment for the sensors 28, 32 and electronics 30, 36.

A first opening 58 is formed within the cover 56, a second opening 60 is formed within the main printed circuit board 24, and a third opening 62 is formed within the auxiliary printed circuit board 26. The openings 58, 6O, 62 are aligned with one another and with the bore 54 of the spacer 52. The attachment member 44 is inserted through the first opening 58, through the second opening 60, through the bore 54, through the third opening 62 and into the housing wall 50. Thus, the same attachment member 44 is inserted through the cover 56, main printed circuit board 24, the spacer 52, and the auxiliary printed circuit board 26.

Preferably, the housing 18 includes a ledge 64 against which the auxiliary printed circuit board 26 abuts. The third opening 62 in the auxiliary printed circuit board 26 is aligned with the ledge 64 such that the attachment member 44 can be inserted through the opening 62 and into the housing wall 50.

Figure 3:
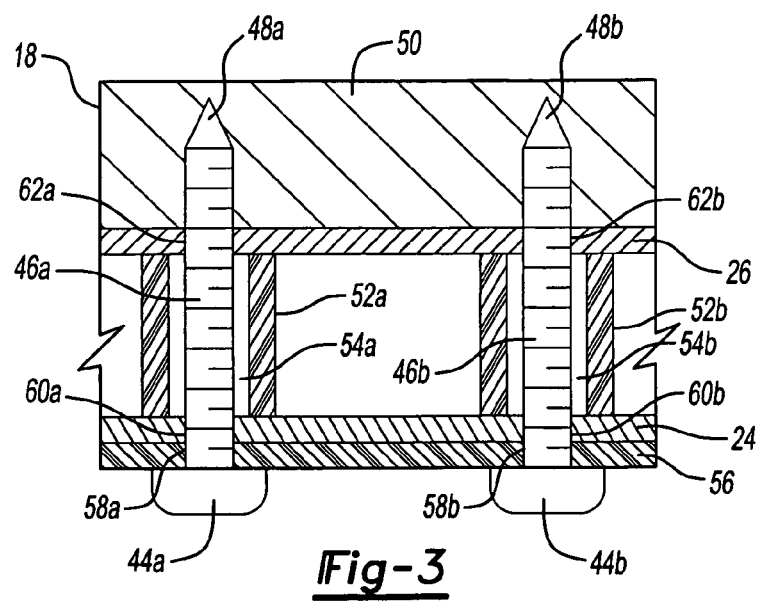
FIG. 3 is a cross-sectional view taken along line 3—3 of FIG. 2.

Preferably, the attachment member 44 comprises at least two fasteners 44a and 44b as shown in FIG. 3. The fasteners 44a, 44b are preferably threaded fasteners that have distal ends 48a, 48b that are threaded into gripping engagement with the housing wall 50. The fasteners 44a, 44b include body portions 46a, 46b that extend through the first openings 58a, 58b, through the second openings 60a, 60b, through the bores 54a, 54b of the rigid spacers 52a, 52b, through the third openings 62a, 62b, and into the housing wall 50. Thus, both fasteners 44a, 44b are inserted through the cover 56, main printed circuit board 24, the spacer 52, and the auxiliary printed circuit board 26 to provide a secure and rigid attachment of the boards 24, 26 to the housing 18.

While at least two fasteners 44a, 44b are preferred, it should be understood that only one fastener 44 may be required. The determination of whether the single fastener mounting configuration can be used is based on system requirements and the specific module configuration.

This packaging and mounting configuration for the control unit and sensor assembly 10 provides several advantages. The attachment members 44a, 44b provide solid attachment to the housing 18, which improves signal transfer to the rollover sensors in the additional sensor assembly 32. Further, because the rollover sensors 32 are mounted on the auxiliary printed circuit board 26, the rollover sensors 32 are isolated from dynamic resonating input generated by the main printed circuit board 24. Also, the configuration minimizes the main printed circuit board space requirements for adding the rollover feature. Thus, additional space is provided on the main printed circuit board 24 for other electrical components.

Another advantage is that the size of the main printed circuit board 24 is standardized for different sensor configurations. The rollover function is an optional content feature, and thus the rollover sensor and associated electronics are not always required. The subject invention provides a compact unit size for modules with and without the rollover sensor feature by providing the same main printed circuit board size for both applications.

Another benefit is that the control unit and sensor assembly 10 is serviceable because the fasteners 44a, 44b can be easily removed and re-installed. The length of the fasteners 44a, 44b can vary depending on the size of the control unit and sensor assembly 10, however, the fasteners 44a, 44b must be long enough to extend through the cover 56, main printed circuit board 24, spacer 52, auxiliary printed circuit board 26, and into the housing wall 50 to form a solid attachment. The use of this type of long fastener 44a, 44b eliminates the need for additional fasteners to secure the cover to the housing 18, etc. Thus, one fastening operation is used to secure multiple components to the housing 18. Further, this mounting configuration is flexible such that different auxiliary 26 and main 24 printed circuit board shapes and sizes are easily accommodated.

Although a preferred embodiment of this invention has been disclosed, a worker of ordinary skill in this art would recognize that certain modifications would come within the scope of this invention. For that reason, the following claims should be studied to determine the true scope and content of this invention.

I claim:

1. A sensor assembly for a safety restraint control unit comprising:
   a main printed circuit board;
   a first sensor supported on said main printed circuit board;
   an auxiliary printed circuit board electrically connected to said main printed circuit board wherein said auxiliary printed circuit board is non-coplanar with said main printed circuit board;
   a second sensor supported on said auxiliary printed circuit board; and
   at least one attachment member that attaches both said main and auxiliary printed circuit boards to a housing.

2. The sensor assembly set forth in claim 1 wherein said auxiliary printed circuit board is spaced apart from and positioned in an overlapping relationship to said main printed circuit board.

3. The sensor assembly set forth in claim 1 wherein said attachment member comprises at least one fastener having a body portion that concurrently secures said main and auxiliary printed circuit boards to said housing.

4. The sensor assembly set forth in claim 1 wherein said first sensor comprises at least one acceleration sensor for measuring a vehicle acceleration and wherein said second sensor comprises at least one rollover sensor for measuring a vehicle angular roll rate.

5. The sensor assembly set forth in claim 1 wherein the housing substantially surrounds said main and auxiliary printed circuit boards.

6. The sensor assembly set forth in claim 1 wherein said attachment member extends through said main and auxiliary printed circuit boards and includes a distal end that is at least partially embedded within the housing.

7. The sensor assembly set forth in claim 1 wherein said main and auxiliary printed circuit boards comprise an electronic control unit that generates an activation signal for a safety restraint device based on data received from said first and second sensors.

8. A control unit and sensor assembly for a safety restraint device comprising:
   a housing;
   a first printed circuit board supported by said housing;
   a second printed circuit board supported by said housing, said second printed circuit board being spaced apart from and positioned in an overlapping relationship to said first circuit board;
   at least one sensor mounted on said second printed circuit board and electrically connected to said first printed circuit board; and
   at least one attachment member that simultaneously secures said first and second printed circuit boards directly to said housing.

9. The assembly set forth in claim 8 wherein said at least one sensor comprises a rollover sensor that measures a vehicle angular rate.

10. The assembly set forth in claim 9 including at least one acceleration sensor mounted on said first circuit board.

11. The assembly set forth in claim 8 wherein said first circuit board includes a first opening, said second circuit board includes a second opening, and said housing includes a third opening, said first, second, and third openings being positioned in alignment with each other to receive said attachment member.

12. The assembly set forth in claim 11 including a rigid tubular support positioned between said first and second printed circuit boards and in alignment with said first, second, and third openings.

13. The assembly set forth in claim 12 including a cover attached to said housing to enclose said first and second printed circuit boards within said housing.

14. The assembly set forth in claim 11 wherein said first printed circuit board comprises a primary printed circuit board and said second printed circuit board comprises an auxiliary printed circuit board electrically connected to said primary printed circuit board with a plurality of pins.

15. The assembly as set forth in claim 8 wherein said attachment member extends through said first and second printed circuit boards to a distal end that is at least partially embedded within said housing.

16. The assembly set forth in claim 8 wherein said first printed circuit board includes a first opening and said second printed circuit board includes a second opening with said at least one attachment member extending through said first and second openings.

17. A method for assembling a safety restraint device control unit and sensor assembly comprising the steps of:
   (a) positioning main and auxiliary printed circuit boards in an overlapping relationship to each other; and
   (b) simultaneously fastening the main and auxiliary printed circuit boards to a sensor housing with a common fastener.

18. The method set forth in claim 17 including the steps of mounting at least one rollover sensor to the auxiliary printed circuit board for generating a vehicle angular rate signal, mounting at least one acceleration sensor to the main printed circuit board for generating a vehicle acceleration signal, and electrically connecting the auxiliary printed circuit board to the main printed circuit board.

19. The method set forth in claim 17 including the step of inserting at least one attachment member through the main and auxiliary printed circuit boards to secure the main and auxiliary printed circuit boards to the sensor housing.

20. The method set forth in claim 17 including the steps of aligning a first hole in the main printed circuit board with a second hole in the auxiliary printed circuit board, and inserting the common fastener through the first and second holes to secure the main and auxiliary printed circuit boards to the sensor housing with a distal end of the common fastener being embedded within a housing wall of the sensor housing.

* * * * *